United States Patent [19]

Gerber

[11] Patent Number: 5,759,049
[45] Date of Patent: Jun. 2, 1998

[54] ELECTRICAL CONTACT CLIP

[75] Inventor: Mark A. Gerber, Plano, Tex.

[73] Assignee: Dallas Semiconductor Corp., Dallas, Tex.

[21] Appl. No.: 647,551

[22] Filed: May 15, 1996

[51] Int. Cl.[6] .................................................. H01R 9/09
[52] U.S. Cl. ........................................ 439/74; 439/862
[58] Field of Search ............................ 439/74, 71, 66, 439/69, 876, 861, 862, 83; 257/785, 666, 678, 727; 361/769, 768, 787, 790; 174/52.4; 24/67.9, 30.55, 30.5 P, 570, DIG. 8, DIG. 29

[56] References Cited

U.S. PATENT DOCUMENTS

| | | | |
|---|---|---|---|
| 4,595,794 | 6/1986 | Wasserman | 174/138 G |
| 4,738,625 | 4/1988 | Burton et al. | 439/66 |
| 5,053,924 | 10/1991 | Kurgan | 439/92 |
| 5,153,710 | 10/1992 | McCain | 357/75 |
| 5,205,751 | 4/1993 | Schwartz et al. | 439/86 |
| 5,276,354 | 1/1994 | Link et al. | 307/66 |
| 5,289,034 | 2/1994 | Hundt | 257/678 |
| 5,561,322 | 10/1996 | Wilson | 257/727 |

FOREIGN PATENT DOCUMENTS

| | | | |
|---|---|---|---|
| 0293592 | 11/1989 | Japan | 439/74 |
| 405082933A | 4/1993 | Japan | 439/876 |
| 2237691 | 5/1991 | United Kingdom | 439/74 |

OTHER PUBLICATIONS

IBM Technical Disclosure Bulletin vol. 29 No. 11 "Edge-Connected J Lead for Ceramic Substrates," Apr. 1987.

*Primary Examiner*—Gary F. Paumen
*Assistant Examiner*—Tho Dac Ta
*Attorney, Agent, or Firm*—Jenkens & Gilchrist

[57] ABSTRACT

A connector for electrically connecting a first conductor on a top surface of a first substrate with a second conductor on a top surface of a second substrate, when the second substrate is positioned beneath the first substrate, the connector includes an electrically conductive clip having a first prong and a second prong, with at least a portion each of the first and second prongs positionable at the top and bottom surfaces of the first substrate respectively, such that the first and second prongs provide a clipping force upon the first substrate to engage the first substrate with the clip. The connector further includes a first electrically conductive contact affixed to the first prong of the clip and is for contacting the first conductor when the clip engages the first substrate. An electrically conductive third prong is connected and extends from the clip, and includes a third electrically conductive contact affixed to the third prong for contacting the second conductor.

17 Claims, 3 Drawing Sheets

ELECTRICAL CONTACT CLIP

PARTIAL WAVER OF COPYRIGHT PROTECTION

A portion of the disclosure of this patent document contains material which is subject to copyright protection. The copyright owner has no objection to the facsimile reproduction by any one of the patent disclosure, as it appears in the United States Patent and Trademark office patent files or records, but otherwise reserves all copyright rights whatsoever.

FIELD OF THE INVENTION

This invention relates generally to electrical connectors for electrically connecting two surfaces, and more particularly, to a flexible connector for electrically connecting a conductive portion of first substrate with a conductive portion of a second substrate.

BACKGROUND OF THE INVENTION

The market for surface mounted Nonvolatile Real Time Clock (NRTC) devices, Nonvolatile Static RAM (NVSRAM) devices, and other lithium battery backed integrated circuits has been limited, among other things, due to the physical characteristics of the devices themselves.

Many current NRTC and NVSRAM devices consist of a large encapsulated part and because of the large size of the encapsulated parts, many electronic devices such as the laptop personal computer and other small scale computers have to be manufactured without these types of NRTC or NVSRAM packages.

Currently, the single chip surface mountable plastic leaded chip carrier (PLCC), small outline integrated circuit (SOIC), thin small outline package (TSOP), and small outline J-lead (SOJ) versions of the NRTC and NVSRAM are sold to electronic manufacturers without a battery or a crystal oscillator. It is the manufacturer who is required to mount a battery and a crystal oscillator on the printed circuit board after the device has been surface mounted.

A major problem with this configuration occurs when a problem with the battery or the crystal oscillator arises or when the product has completed its useful life. When these situations occur the old battery and crystal oscillator have to be un-soldered prior to the installation of a replacement battery and crystal. This process is very timely and ultimately leads to higher manufacturing cost.

One device manufacture, SGS Thompson, has made a device having a battery and crystal module attachable to a modified NRTC device. The battery and crystal module has contact pins which extend from the module and are inserted into matching female receptacles in the NRTC device. The battery and crystal module is designed to be attached to the NRTC device after the NRTC device has been surface mounted.

While the SGS Thompson's device does have some advantages over the current DIP lead technology, the height of the device is still too large for many applications. In addition, because this device is a single chip device, the market demand for high density memory devices which combine a controller chip and a separator memory chip, can not be met. Further, these devices are not compatible with market standard NRTCs having TSOP, PLCC, SOIC, or SOJ chips.

Currently, there also is a Low Profile Module (LPM) for NVSRAMs that requires the user to provide an additional socket which must be surface mounted prior to the installation of the LPM. The socket and LPM device have a larger area and larger height associated with it due to the addition of the socket.

One proposed solution to the problems of current technologies described above is an NVSRAM or NRTC replaceable power module having two stacked layers of circuitry, each being removably positioned within a housing. One layer includes a small printed circuit board (PCB) having a crystal oscillator and a power supply and the other layer includes a PCB with the circuitry for the NVSRAM or the NRTC mounted thereon. In use, the PCB's are stacked within the housing, thereby keeping the size of the device to a minimum. However, one problem encountered with this proposed solution is being able to provide a reliable electrical connection between the two PCB layers and at the same time also providing easy assembly and disassembly of the NVSRAM or NRTC device.

SUMMARY OF THE INVENTION

The present invention overcomes the above identified problems as well as other shortcomings and deficiencies of existing technologies by providing a flexible connector for electrically connecting together conductive portions of two substrates.

Accordingly, the present invention provides a connector for electrically connecting a first conductor, the first conductor being disposed on a top surface of a first substrate, with a second conductor, the second conductor being disposed on a top surface of a second substrate, when the second substrate is positioned beneath the first substrate such that the top surface of the second substrate faces in a direction towards a bottom surface of the first substrate. The connector includes a clip having first, and second prongs and also includes a third prong. At least a portion of the first and second prongs are positionable at the top and bottom surfaces of the first substrate, respectively. The first and second prongs provide a clipping force upon the first substrate to engage the first substrate with the clip. The connector further includes a first electrical contact affixed to the first prong of the clip for contacting the first conductor and includes a second electrical contact affixed to the third prong for contacting the second conductor. The connector further includes an electrically conductive path for electrically connecting the first contact with the second contact.

BRIEF DESCRIPTION OF THE DRAWINGS

A more complete understanding of the present invention may be had by reference to the following Detailed Description when taken in conjunction with the accompanying Drawings wherein.

DETAILED DESCRIPTION

Figure 1:
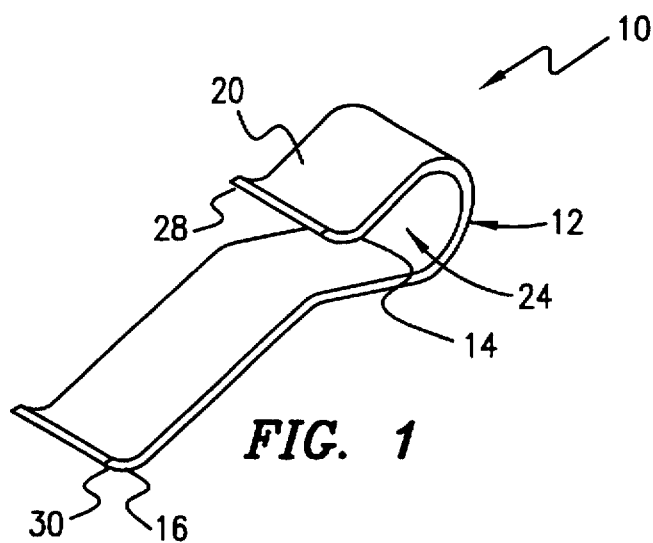
FIG. 1 is a perspective view of an embodiment of the present invention.
Figure 2:
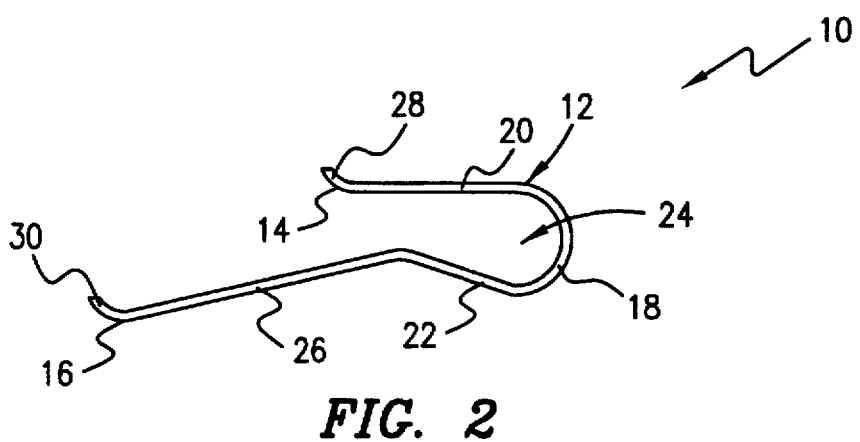
FIG. 2 is a side elevation view of an embodiment of the present invention as similarly shown in FIG. 1.

Referring now to the drawings wherein like or similar elements are designated with identical reference numerals throughout the several views, and wherein the various elements depicted are not necessarily drawn to scale, and in particular, to FIGS. 1 & 2, there is shown a preferred embodiment of the present invention in the form of an electrical connector 10. Connector 10 includes a flexible clipping portion 12, and electrical contact portions 14 and 16.

Clipping portion 12 includes a generally arcuate portion 18 and two prongs 20 and 22. Prongs 20 and 22 each extend from arcuate portion 18 such that prongs 20 and 22 along with arcuate portion 18 define a slot 24 therein. Prong 22 is normally biased extending away from arcuate portion 18 and towards prong 20. This provides a clipping force such that when an item, such as a printed circuit board, is inserted into slot 24, prongs 20 and 22 engage the item.

Connector 10 further includes prong 26 which extends from prong 22. Prong 26 is normally biased extending away from prong 20.

As depicted electrical contact portion 14 is integral with prong 20 at an end of prong 20 distal to arcuate portion 18. Similarly electrical contact portion 16 is integral with prong 26 at an end of prong 26 distal to prong 22. Although electrical contact portions 14 and 16 are shown to be integrated with prongs 20 and 26, it is contemplated that the present invention can be practiced by one skilled in the art with electrical contact portions 14 and 16 affixed to prongs 20 and 26.

Connector 10 further includes lip portions 28 and 30 located at the ends of prongs 20 and 26 respectively. Lip portion 28 facilitates the insertion of an item into slot 24, while lip portion 30 helps to ensure the proper positioning of contact portion 16 of connector 10 on the second substrate when the first substrate is positioned onto the second substrate (see FIGS. 3 & 4).

Connector 10 is comprised of a conductive material which thereby provides an electrically conductive path between electrical contact portion 14 and electrical contact portion 16.

Although good results have been achieved utilizing an electrically conductive material to make connector 10, it is contemplated that conductive as well as non-conductive materials can be used to make the present invention so long as a conductive path is provided between contact 14 and contact 16. For example, prongs 20, 22 and 26, and portion 18 could be made out of a nonconductive material, such as plastic, with contact portions 14 and 16 electrically connected by a wire or strip of conductive material traversing connector 10 either internally or externally.

Figure 3:
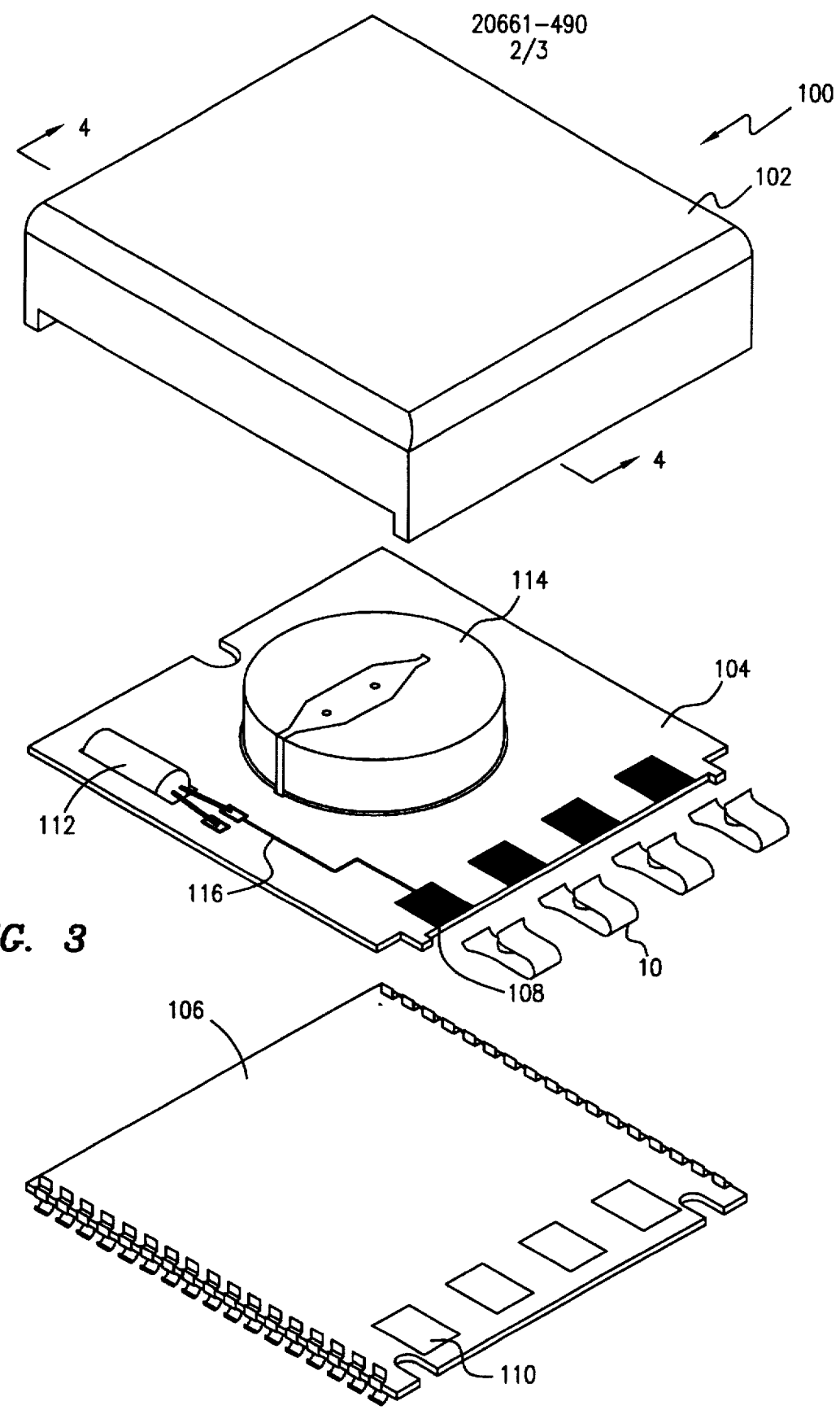
FIG. 3 is an exploded perspective view of an electronic component which may employ the present invention.

Referring now to FIG. 3, there is illustrated an exploded perspective view of an electronic component 100 utilizing multiple clips, such as connector 10 of the present invention. As depicted component 100 includes a cap 102, printed circuit boards (PCBS) 104 and 106. PCB 104 includes multiple contact pads, such as contact pad 108, disposed on the top surface thereof. Similarly PCB 106 includes multiple contact pads, such as contact pad 110, disposed on the top surface thereof.

The contact pads on each of PCB 104 and 106 are electrically connected to selected electronic components that would be mounted on each of PCBs 104 and 106. For example, in this particular embodiment of electronic component 100, PCB 104 includes a crystal oscillator 112 and a power supply or battery 114 which are ultimately used for timing and power functions for electronic component 100. Circuit path 116 electrically connects a terminal of crystal 112 with contact pad 108.

To assemble electronic component 100, each connector 10 is aligned with PCB 104 such that when PCB 104 is inserted into the slots 24 of the connectors 10, the contact portions 14 of connector 10 come into contact with pads 108. The clipping force provided by prongs 20 and 22 help to engage PCB 104 with connector 10. To further secure the connectors 10 to PCB 104, good results have also been achieved by soldering connectors 10 onto contact pads 108.

PCB 104 is then placed into cap 102. PCB 106 is then placed into cap 102 such that contact pads 108 are in alignment with clips 10.

Figure 4:
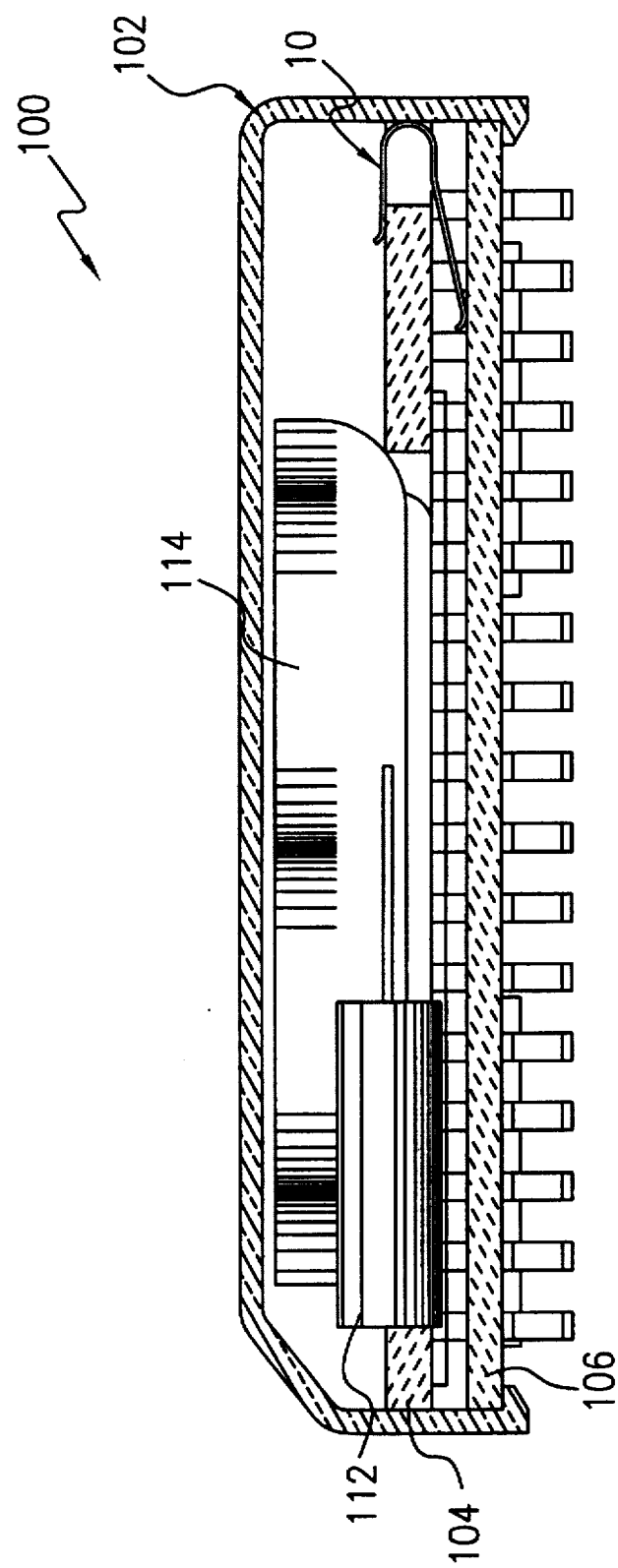
FIG. 4 is a sectional view taken along line 4—4 of FIG. 3 illustrating the employment of the present invention in an assembled electronic component.

Referring now to FIG. 4, there is depicted a cross-sectional view of the assembled electronic component 100. As illustrated connector 10 provides an electrical connection between PCB 104 and 106. As can be appreciated the normal biasing of prong 26, extending away from prong 20, helps maintains contact with PCB 106 with varying amounts of space between PCBs 104 and 106. This is especially important when the PCBs cannot be mounted flush with each other, such as depicted when the oscillator and battery 114 extend through the printed circuit board to conserve the overall height of electronic component 100.

CONCLUSION

Although a preferred embodiment of the present invention has been illustrated in the accompanying Drawings and described in the foregoing Detailed Description, it will be understood that the invention is not limited to the embodiment disclosed, but is capable of numerous rearrangements, modifications and substitutions without departing from the spirit of the invention as set forth and defined by the following claims.

What is claimed is:

1. A connector for electrically connecting a first conductor, the first conductor being disposed on a top surface of a first substrate, with a second conductor, the second conductor being disposed on a top surface of a second substrate, when the second substrate is positioned beneath the first substrate such that the top surface of the second substrate faces in a direction towards a bottom surface of the first substrate, said connector comprising:

a substantially J-shaped clip for engaging the first substrate, said clip including a first prong, a second prong and a generally arcuate portion, said first and second prongs extending from said generally arcuate portion, said first prong comprises a first contact portion positionable upon the top surface of the first substrate for contacting the first conductor when said clip engages the first substrate and said second prong comprises a second contact portion positionable upon the bottom surface of the first substrate, said second contact portion for engaging the bottom surface of the first substrate;

said first prong comprises a lead in portion extended from said first contact portion to a top end portion, wherein said lead in portion of said first prong is bent away from said second prong;

a third prong connected to an end of said second prong distal to said generally arcuate portion, said third prong extending at a forward angle distal to said generally arcuate portion, said third prong comprises a third contact portion, and a lead in portion extended from said third contact portion to a top end portion, wherein said lead in portion of said third prong is bent toward said first prong, said third contact portion for maintaining contact with the second substrate and contacting the second conductor when a spacing between the first substrate and the second substrate is within a selected range;

an electrically conductive path electrically connecting said first contact portion and said third contact portion; and said first prong forms a first arm of said clip, and said second and third prongs form a second arm of said clip, whereby said second arm has a longer length than said first arm.

2. A connector as recited in claim 1, wherein:
said first and second prongs provide a clipping force upon the first substrate to clippingly engage the first substrate with said clip when said first prong is positioned at the top surface of the first substrate and when said second prong is positioned at the bottom surface of the first substrate.

3. A connector as recited in claim 1, wherein:
said second prong extends from said arcuate portion towards said first prong.

4. A connector as recited in claim 1, wherein:
said electrically conductive path includes electrically conductive material integral with said clip and said third prong.

5. A connector as recited in claim 1, wherein:
said clip comprises an electrically conductive material.

6. A connector as recited in claim 5, wherein:
said first contact portion is integral with said first prong of said clip.

7. A connector as recited in claim 1, wherein:
said third prong comprises an electrically conductive material.

8. A connector as recited in claim 7, wherein:
said third contact portion is integral with said third prong.

9. A connector for electrically connecting a first conductor, the first conductor being disposed on a top surface of a first substrate, with a second conductor, the second conductor being disposed on a top surface of a second substrate, when the second substrate is positioned beneath the first substrate such that the top surface of the second substrate faces in a direction towards a bottom surface of the first substrate, said connector comprising:

a substantially J-shaped clip for engaging the first substrate, said clip including a first prong, a second prong and a generally arcuate portion, said first and second prongs extending from said generally arcuate portion, said first prong comprises a first contact portion positionable upon the top surface of the first substrate for contacting the first conductor when said clip engages the first substrate and said second prong comprises a second contact portion positionable upon the bottom surface of the first substrate, said second contact portion for engaging the bottom surface of the first substrate, said first contact portion and said second contact portion configured to provide a clipping force upon the first substrate to clippingly engage the first substrate with said clip;

said first prong comprises a lead in portion extended from said first contact portion to a top end portion, wherein said lead in portion of said first prong is bent away from said second prong;

a third prong connected to an end of said second prong distal to said generally arcuate portion, said third prong extending at a forward angle distal to said generally arcuate portion, said third prong comprises a third contact portion, and a lead in portion extended from said third contact portion to a top end portion, wherein said lead in portion of said third prong is bent toward said first prong, said third contact portion for maintaining contact with the second substrate and contacting the second conductor when a spacing between the first substrate and the second substrate is within a selected range;

an electrically conductive path electrically connecting said first contact portion and said third contact portion; and said first prong forms a first arm of said clip, and said second and third prongs form a second arm of said clip, whereby said second arm has a longer length than said first arm.

10. A connector as recited in claim 9, wherein:
said first contact portion is integral with said first prong of said clip.

11. A connector as recited in claim 10, wherein: said third contact portion is integral with said third prong.

12. A connector as recited in claim 9, wherein:
said second prong extends from said arcuate portion towards said first prong.

13. A connector as recited in claim 12, wherein:
said electrically conductive path includes electrically conductive material integral with said clip and said third prong.

14. A connector for electrically connecting a first conductor, the first conductor being disposed on a top surface of a first substrate, with a second conductor, the second conductor being disposed on a top surface of a second substrate, when the second substrate is positioned beneath the first substrate such that the top surface of the second substrate faces in a direction towards a bottom surface of the first substrate, said connector comprising:

an electrically conductive substantially J-shaped clip including a first prong, a second prong and a generally arcuate portion, said first and second prongs extending from said generally arcuate portion, said first prong comprises a first contact portion positionable upon the top surface of the first substrate for electrically contacting the first conductor when said clip engages the first substrate and said second prong comprises a second contact portion positionable upon the bottom surface of the first substrate, said second contact portion for engaging the bottom surface of the first substrate, said first contact portion and said second contact portion configured to provide a clipping force upon the first substrate to clippingly engage the first substrate with said clip;

said first prong comprises a lead in portion extended from said first contact portion to a top end portion, wherein said lead in portion of said first prong is bent away from said second prong;

an electrically conductive third prong connected to an end of said second prong distal to said generally arcuate portion, said third prong extending at a forward angle distal to said generally arcuate portion, said third prong comprises a third contact portion and a lead in portion extended from said third contact portion to a top end portion, wherein said lead in portion of said third prong is bent toward said first prong, said third contact portion for maintaining contact with the second substrate and electrically contacting the second conductor when a spacing between the first substrate and the second substrate is within a selected range; and said first prong forms a first arm of said clip, and said second and third prongs form a second arm of said clip, whereby said second arm has a longer length than said first arm.

15. A connector as recited in claim 14, wherein:
said second prong extends from said arcuate portion towards said first prong.

16. A connector as recited in claim 15, wherein:
said first contact portion is integral with said first prong of said clip.

17. A connector as recited in claim 16, wherein:
said third contact portion is integral with said third prong.

* * * * *

UNITED STATES PATENT AND TRADEMARK OFFICE
CERTIFICATE OF CORRECTION

PATENT NO : 5,759,049
DATED : June 2, 1998
INVENTOR(S) : Mark A. Gerber

It is certified that error appears in the above-identified patent and that said Letters Patent are hereby corrected as shown below:

[57] Abstract, line 15    Replace "third"
                          With --second--

Signed and Sealed this

Third Day of April, 2001

Attest:

NICHOLAS P. GODICI

Attesting Officer    Acting Director of the United States Patent and Trademark Office